United States Patent
De Paëpe et al.

(10) Patent No.: US 10,175,311 B2
(45) Date of Patent: Jan. 8, 2019

(54) THERMAL INSULATION DEVICE AND METHOD OF OPERATION OF SUCH A DEVICE

(71) Applicant: COMMISSARIAT A L'ENERGIE ATOMIQUE ET AUX ENERGIES ALTERNATIVES, Paris (FR)

(72) Inventors: Gaël De Paëpe, Voiron (FR); Eric Bouleau, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1040 days.

(21) Appl. No.: 14/377,091

(22) PCT Filed: Feb. 7, 2013

(86) PCT No.: PCT/EP2013/052398
§ 371 (c)(1),
(2) Date: Aug. 6, 2014

(87) PCT Pub. No.: WO2013/117627
PCT Pub. Date: Aug. 15, 2013

(65) Prior Publication Data
US 2015/0048829 A1    Feb. 19, 2015

(30) Foreign Application Priority Data
Feb. 7, 2012   (FR) .................... 12 51115

(51) Int. Cl.
*G01R 33/31*   (2006.01)
*G01R 33/30*   (2006.01)
*G01R 33/34*   (2006.01)

(52) U.S. Cl.
CPC .......... *G01R 33/31* (2013.01); *G01R 33/307* (2013.01); *G01R 33/3403* (2013.01)

(58) Field of Classification Search
CPC ... G01R 33/31; G01R 33/307; G01R 33/3403
See application file for complete search history.

(56) References Cited

U.S. PATENT DOCUMENTS 3,588,677 A   6/1971 Kleiman et al.
4,254,373 A   3/1981 Lippmaa et al.
(Continued)

FOREIGN PATENT DOCUMENTS

FR   2008564 A1   1/1970
FR   2393304 A1   12/1978
(Continued)

OTHER PUBLICATIONS

Japanese Office Action and search report dated Nov. 22, 2016 in counterpart Japanese application No. 2014-556048; with English partial translation and partial machine translation (32 pages).
(Continued)

*Primary Examiner* — Dixomara Vargas
(74) *Attorney, Agent, or Firm* — Westerman, Hattori, Daniels & Adrian, LLP

(57) ABSTRACT

Method for operating a thermal insulation device (100) comprising a screen (101, 102, 103, 104) for insulating a first member (21) and/or a second member (20; 30; 16; 10; 30) from a thermal radiation, the method comprising:
- a heat-exchange step in which heat is exchanged between a stream of a fluid, notably a gas, and the screen, notably a step of transferring heat from the heat screen to the stream, and
- a use step in which the stream is used for guiding the first member (21) and/or for driving the movement of the first member and/or for exchanging heat with the first member, notably for cooling the first member.

17 Claims, 2 Drawing Sheets

(56) References Cited

U.S. PATENT DOCUMENTS

| | | | |
|---|---|---|---|
| 4,492,088 A | 1/1985 | Ibrahim et al. | |
| 4,511,841 A | 4/1985 | Bartuska et al. | |
| 4,587,492 A | 5/1986 | Laudermilch | |
| 4,926,647 A | 5/1990 | Dorri et al. | |
| 5,192,910 A | 3/1993 | Hepp et al. | |
| 5,508,613 A * | 4/1996 | Kotsubo | F25D 19/006 324/315 |
| 6,437,570 B2 * | 8/2002 | Marek | G01R 33/30 324/300 |
| 6,441,617 B2 * | 8/2002 | Marek | G01R 33/30 324/300 |
| 6,466,019 B2 * | 10/2002 | Marek | G01R 33/30 324/318 |
| 6,838,880 B2 * | 1/2005 | Hofmann | G01R 33/307 324/318 |
| 7,030,613 B2 * | 4/2006 | Morita | G01R 33/31 324/318 |
| 7,126,335 B2 * | 10/2006 | Morita | G01R 33/31 324/318 |
| 7,408,353 B2 * | 8/2008 | Marek | G01R 33/3415 324/318 |
| 7,560,932 B2 * | 7/2009 | Fukuda | G01R 33/3621 324/300 |
| 7,701,217 B2 * | 4/2010 | Withers | G01R 33/34053 324/318 |
| 7,928,820 B2 * | 4/2011 | Chiba | G01R 33/3815 324/318 |
| 9,335,389 B2 * | 5/2016 | Takegoshi | G01R 33/30 |
| 9,372,247 B2 * | 6/2016 | Takegoshi | G01R 33/3403 |
| 2001/0026302 A1 | 10/2001 | Silverbrook | |
| 2006/0130493 A1 | 6/2006 | Strobel | |
| 2007/0007963 A1 | 1/2007 | Kawasaki et al. | |

FOREIGN PATENT DOCUMENTS

| | | |
|---|---|---|
| FR | 2547125 A1 | 12/1984 |
| GB | 1358846 A | 7/1974 |
| JP | S47-4348 A | 3/1972 |
| JP | S57-19379 B | 4/1982 |
| JP | S59-178347 A | 10/1984 |
| JP | H04-262279 A | 9/1992 |
| JP | 2006-029965 A | 2/2006 |
| JP | 2007-17391 A | 1/2007 |
| JP | 2008-075893 A | 4/2008 |
| JP | 2008-241493 A | 10/2008 |

OTHER PUBLICATIONS

EPO Office Action dated Apr. 14, 2016 in counterpart European application No. EP 13702655.5; with English machine translation (15 pages) (US20060130493 cited in the EPO Office Action was listed in a previous IDS).

Barnes A B et al., "Cryogenic sample exchange NMR probe for magic angle spinning dynamic nuclear polarization", J. of Magnetic Resonance, vol. 198, No. 2, Jun. 1, 2009, pp. 261-270; in English; cited in EPO Office Action dated Apr. 14, 2016.

International Search Report dated Apr. 24, 2013, issued in corresponding application No. PCT/EP2013/052398.

Mizuno, Takashi, et al., "Development of a magic-angle spinning nuclear magnetic resonance probe with a cryogenic detection system for sensitivity enhancement", Review of Scientific Instruments, Apr. 28, 2008, vol. 79, No. 4, pp. 44706-1-44706-6, cited in ISR.

Japanese Office Action dated Aug. 15, 2017 in counterpart Japanese application No. 2014-556048; with English translation and machine translation (8 pages) (JP2008-241493 and JPS59-178347 cited in the Japanese Office Action are not listed in this IDS since they were already listed in the IDS filed Feb. 8, 2017).

* cited by examiner

THERMAL INSULATION DEVICE AND METHOD OF OPERATION OF SUCH A DEVICE

FIELD OF THE INVENTION

The invention relates to a thermal insulation method or to a method for operating a thermal insulation device. The invention also relates to a thermal insulation device, notably a device for thermally insulating all or part of a nuclear magnetic resonance (NMR) system, particularly a system suited to analysing a sample of a substance.

BACKGROUND ART

An NMR device comprises a probe comprising a sample holder made to spin in a static magnetic field and exposed to a second magnetic field perpendicular to the first, for example created by a radiofrequency coil, which in return receives a signal which is analysed in order to deduce therefrom information about a sample, notably a solid sample, placed in the sample holder. According to an embodiment of the prior art, three streams of gas coming from one and the same source, a standard container such as a raised-pressure helium cylinder, are directed towards the probe of the device which comprises the sample holder. The first stream has the function of spinning this sample holder, by acting on the blades or vanes of a turbine that drives a rotor (or spinner) which comprises the sample holder. The second stream has the function of bringing the sample to a certain temperature, and the third stream creates an aerostatic bearing that supports the rotor in the stator.

In such a device, it is important to eliminate the risk of atmospheric gases condensing on the probe in the event of low-temperature operation and to define a probe design that guarantees that the ad hoc temperature can be obtained at the sample holder.

There are various conditions that need to be met in order to achieve this:
  The probe needs to be insulated from the surrounding atmosphere in order to protect it from the condensation and convection of gas in order to eliminate the introduction of heat from outside by convection and as a result of conduction in the gas.
  The probe, the spinner and the device supplying it with fluid need to be protected from the surrounding thermal radiation at a temperature of around 300K.

Because the probe and, more extensively, the NMR device, operate at a very low temperature, it is necessary to lag these in order to achieve the desired temperatures and/or in order not to consume excessive amounts of energy in order to cool them.

There are various known techniques for lagging or insulating a cooled device, notably:
  surrounding it in insulating materials that make it possible to avoid losses by convection or even by conduction, or
  the placement of radiation-impeding screens that make it possible to avoid losses by radiation.

The temperature of a radiation-impeding screen is influenced by the "hot" components and the "cold" components that face the screen. This influence varies with the fourth power of the difference in temperature of the hot components and the cold components, the temperature of the screen being influenced mainly by the "hot" components, particularly when operating at very low temperature.

SUMMARY OF THE INVENTION

It is an object of the invention to provide a method for operating an insulation device that makes it possible to overcome the problems mentioned hereinabove and that improves the methods known from the prior art. In particular, the invention proposes a method for operating an insulation device that makes possible insulation that is effective and/or consumes little by way of energy. The invention also relates to an insulation device that operates in accordance with such a method.

The method according to the invention governs the operation of a thermal insulation device comprising a screen for insulating a first member and/or a second member from a thermal radiation. The method comprises:
  a heat-exchange step in which heat is exchanged between a stream of a fluid, notably a gas, and the screen, notably a step of transferring heat from the heat screen to the stream, and
  a use step in which the stream is used for guiding the first member and/or for driving the movement of the first member and/or for exchanging heat with the first member, notably for cooling the first member.

The use step may be performed first, followed by the heat-exchange step.

The first member may comprise a sample holder and/or the second member may comprise an NMR probe and/or a cryogenic line and/or a cryostat and/or an electronic circuit.

According to the invention, a thermal insulation device comprises a screen insulating a first member and/or a second member from a thermal radiation. It comprises:
  a first heat-exchange element exchanging heat between the heat screen and a stream of fluid, notably a stream of gas, and
  a guide element guiding the first member using the stream and/or a drive element driving the first member using the stream and/or a second heat-exchange element of the first member using the stream.

The first exchange element may be thermally coupled to the thermal insulation screen, and notably be fixed to the thermal insulation screen, or the first exchange element may be comprised between two walls of the thermal insulation screen.

The first exchange element may be a helical strip.

The heat screen may have a solid angle of at least $\pi$ steradians, or even of at least $2\pi$ steradians, or even of at least $3\pi$ steradians, or even substantially of $4\pi$ steradians as seen from the centre of gravity of the first member and/or of the second member, or even from any point on the first member and/or on the second member.

The insulation device may comprise a guide element guiding the stream of fluid between:
  the first heat-exchange element, and
  the guide element guiding the first member using the stream and/or the drive element driving the first member using the stream and/or the second heat-exchange element of the first member using the stream.

According to the invention, an NMR analysis probe system comprises a thermal insulation device defined hereinabove and an NMR analysis probe.

According to the invention, an NMR analysis system comprises a thermal insulation device defined hereinabove and an NMR probe defined hereinabove.

The analysis system may comprise a probe system, a cryostat and a cryogenic line connecting the probe onto the cryostat.

The cryogenic line may comprise a vacuum barrier.

The analysis system may comprise a sample holder able to accept a sample for analysis, and at least one first source of a high-pressure gas for generating the stream.

BRIEF DESCRIPTION OF THE DRAWINGS

These objects, features and advantages of the present invention will be set out in detail in the following description of one particular embodiment which is given nonlimitingly with reference to the attached figures among which.

DETAILED DESCRIPTION OF PARTICULAR EMBODIMENTS

Figure 1:
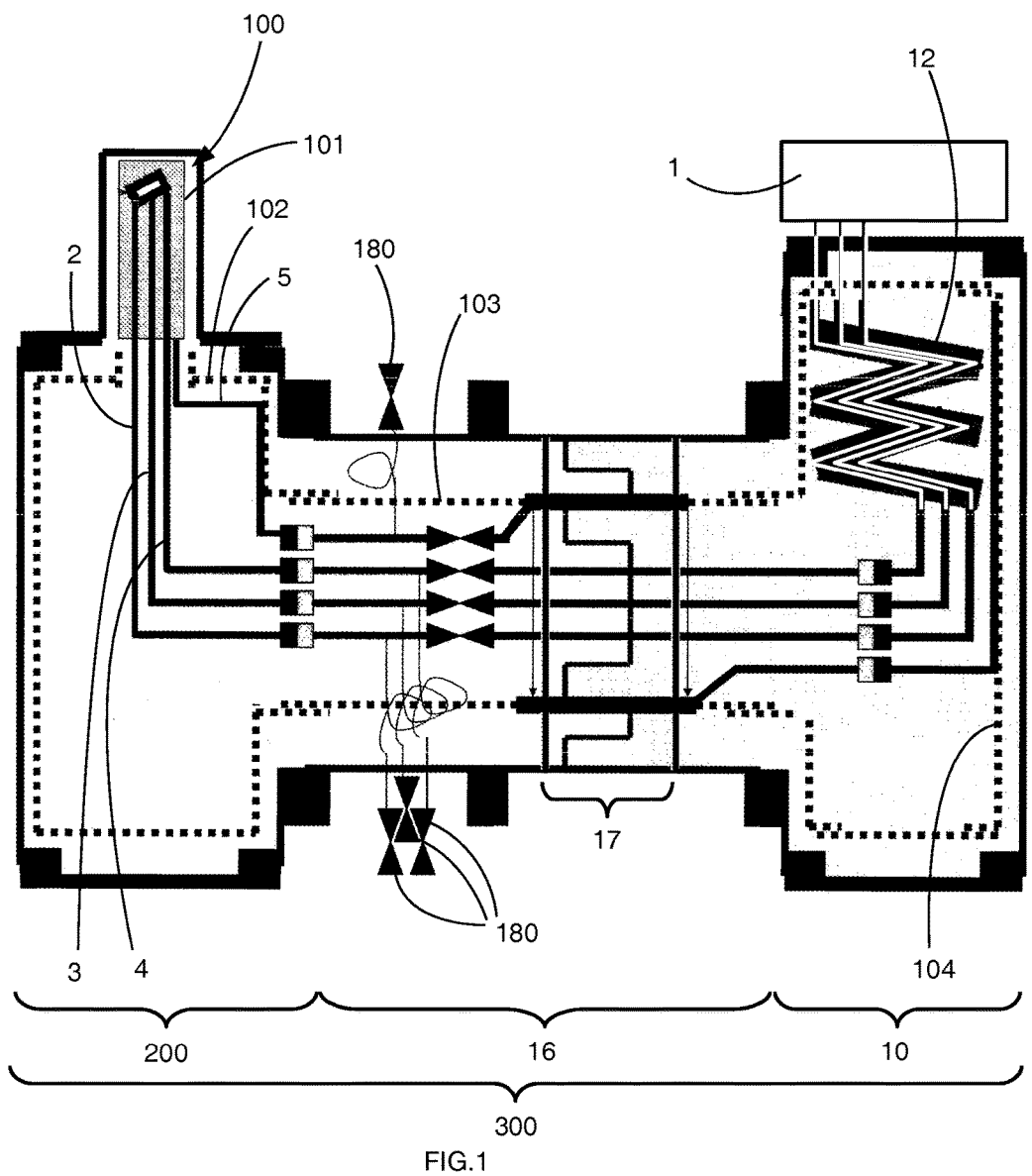
FIG. 1 schematically depicts an NMR system according to one embodiment of the invention.
Figure 2:
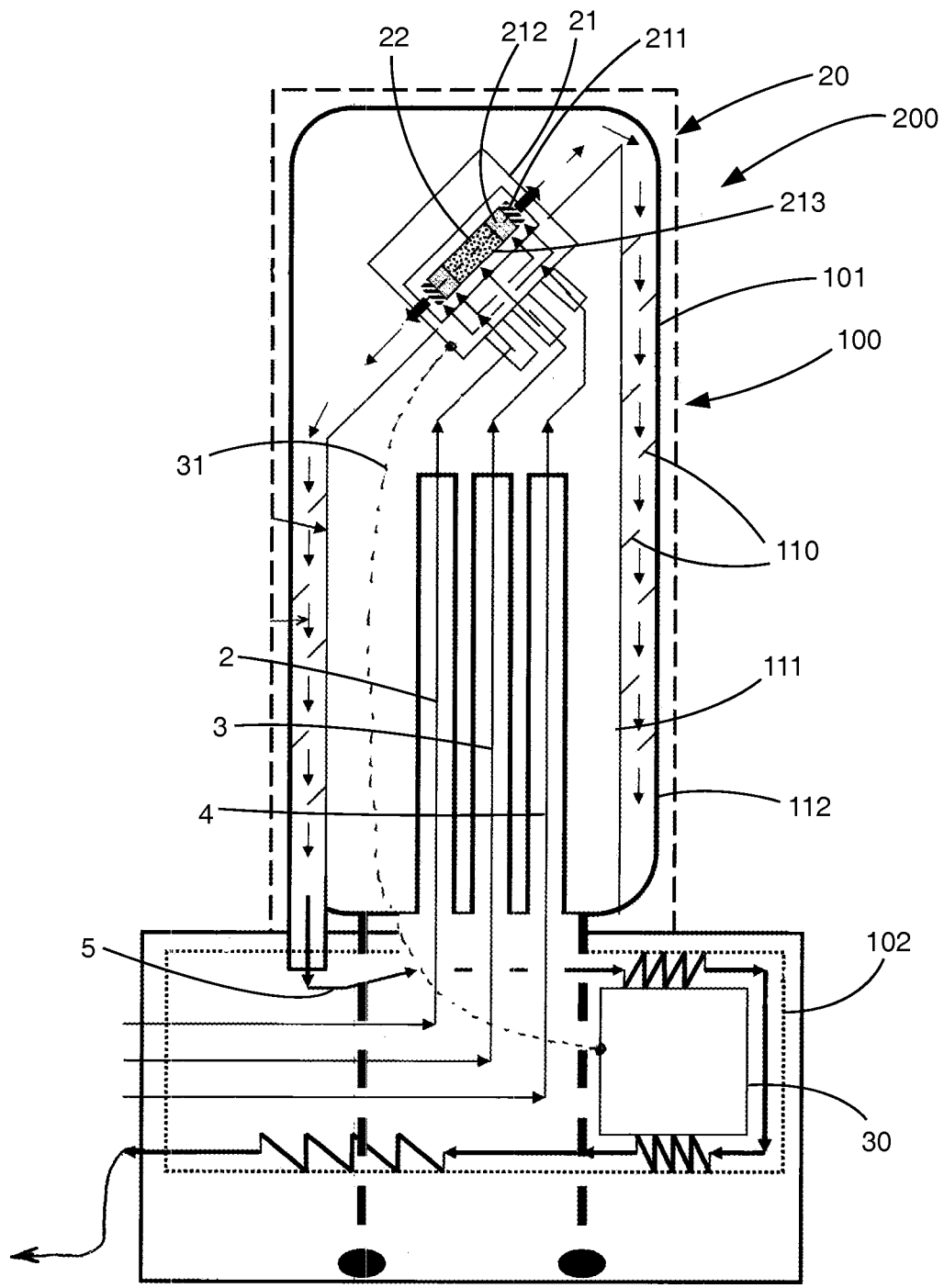
FIG. 2 schematically depicts an NMR probe according to one embodiment of the invention.

One embodiment of an insulation device 100 is described hereinafter with reference to FIGS. 1 and 2, as applied to an NMR analysis system 300. However, the insulation device can be used for any other application.

The NMR analysis system 300 comprises the insulating device 100. It is for example a magic-angle spinning NMR analysis system in which the sample is spun at the magic angle. For example, the analysis system comprises at least one first high-pressure source 1 able to generate three high-pressure gas streams 2, 3, 4. As an alternative it is of course possible to use several sources each one dedicated to one or more streams. This source 1 may for example consist of a cylinder of gas compressed to 200 bars at ambient temperature. The pressure can be controlled by flow meters coupled to regulating valves. The high-pressure gas from this first source 1 can be nitrogen or helium. The three gas streams coming from this first source 1 pass through a cryostat 10, in which they are cooled in one or more heat exchangers 12, before reaching an NMR probe 20 comprising a sample holder 21 intended to accept a sample 22. The sample holder is positioned so that it is inclined at an adjustable angle comprised between the parallel and perpendicular axes of a static magnetic field. Radio frequency components forming an emitter/receiver, designed to receive in return a signal from the sample for analysis, are also exposed to the cooling gas stream and are subjected to the same temperature as the sample holder 21. In order to be able to reach very low temperatures, the heat exchangers 12 are supplied with a low-pressure cryogenic fluid, at a low temperature below the temperature of the gas of the first source 1, which serves as a refrigerant, coming from one or more second source(s) separate from the high-pressure first source 1. This refrigerant may also be nitrogen or helium.

The heat exchanger may be of the countercurrent tubular fluid/fluid type. It allows a transfer of heat between the two fluids, causing a cooling of the high-pressure gas streams 2, 3, 4. This exchange of heat between the two fluids is obtained by forced convection between the gas streams 2, 3, 4 and the wall of their respective high-pressure tubes, then by conduction through this wall, prior to a further forced convection between the exterior surface of this wall of the high-pressure tubes and the refrigerant. These tubes may be made of a material suited to cryogenics, for example a grade of austenitic stainless steel referred to as a low carbon stainless steel.

The cryostat 10 takes the overall form of a vacuum chamber closed by a removable plate which allows access to its insides. The cryostat may advantageously comprise a heat screen 104.

Next, on leaving the cryostat 10, the three gas streams 2, 3, 4 reach the NMR probe 20, advantageously all cooled to the same temperature, and perform the three functions mentioned hereinabove, namely the first high-pressure stream 2 makes the sample spin, the second high-pressure stream 3 cools the sample and the third high-pressure stream 4 supports the sample holder.

A rigid cryogenic line 16 conveys the cooled high-pressure gas streams 2, 3, 4 from the outlet of the cryostat 10 as far as the NMR probe device 20. This line is short, being of the order of one meter long, insulated, pumped by a high-vacuum pump and equipped with a heat screen 103. The NMR probe 20 comprises a sample holder 21 capable of spinning, positioned in a stator (not depicted) that establishes the static magnetic field for the NMR measurement.

The system comprises electronic components 30, notably radio frequency components, for example in a region of the probe device 200. A connection 31 allows an electric circuit 30 to be coupled to the spinner.

The thermal insulation device 100 comprises a screen 101, 102, 103, 104 thermally insulating a first member 21 and/or a second member 20; 30; 16; 10; 40 from a thermal radiation. The thermal radiation may be caused by any element in the immediate surroundings of the first member or of the second member, notably any body situated in these surroundings. The insulation device comprises:

a first heat-exchange element 110 exchanging heat between the heat screen and the stream of fluid, notably the stream of gas, and a guide element 211 guiding the first member using the stream and/or a drive element 212 driving the first member using the stream and/or a second heat-exchange element 213 of the first member using the stream.

The guide element 211 is supplied with the gas stream 4, the drive element 212 is supplied with the gas stream 2 and the heat-exchange element 213 of the first member is supplied with the gas stream 3. The guide element may be a bearing, notably an aerostatic bearing or an aerodynamic bearing. Thus, one stream can be used to guide the first member. The drive element may be a turbine. Thus, one stream may be used for driving the movement of the first member.

The first heat-exchange element 110 is able to cool the screen or the screens. Thus, the temperature of the screen or of the screens is not much influenced by the environment external to the screen. The screen or screens is or are preferably made of metal so that they have high thermal conductivity and/or a low ability to absorb thermal radiation.

For preference, the first member comprises the sample holder and/or the second member comprises the NMR probe 20 and/or the cryogenic line 16 and/or the cryostat 10 and/or the electronic circuit 30. Thus, the device may comprise a first thermal insulation screen 101, 102 protecting the sample holder 21 and the sample of substance 22 and, more generally, the probe 20 and possibly the electronic circuit. The insulation device may also comprise a second thermal insulation screen 103 protecting the cryogenic line 16 and/or the insulation device may comprise a third thermal insulation screen 104 protecting the cryostat 10. The various screens may be thermally coupled to one another.

The first exchange element 110 is comprised between two walls 111 and 112 of the thermal insulation screen. It may consist of a helical strip 110.

One, two or three of the streams 2, 3, 4 of fluid pass over or through the first exchange element after they have performed their function at the probe, notably at the sample holder. To achieve that, the insulation device comprises a guide element guiding the stream of fluid between:

the first heat-exchange element 110, and the guide element 211 guiding the first member using the stream and/or the drive element 212 driving the first member using the stream and/or the second heat-exchange element 213 of the first member using the stream.

Given how much stream is needed to spin the sample holder, the cryogenic fluid used gives up only some of its thermal energy (enthalpy) to bring the sample to the ad hoc temperature. Also, the stream expelled at the output of the sample spinner is collected so that the thermal energy still available can be recovered and advantageously used. In order to do that, the "drive" and "thermal regulation" gas streams removed at the exhaust of the spinner are collected directly in the chamber in which it is installed. The spinner is thus kept in a low-temperature atmosphere of gas which effectively protects it from external radiation. The chamber is itself equipped with an outlet via which this gas is discharged via a line 5 to exchangers thermally coupled with active thermal protection or insulation screens, notably an exchanger thermally coupled with the screen 102 that protects the probe, an exchanger thermally coupled with the active heat screen 103 that protects the cryogenic supply line and possibly an exchanger thermally coupled with the active heat screen 104 that protects the cryostat, which is the source of cryogenic power. The gas may also pass through an exchanger thermally coupled to the electronic circuit 30. The shape of the chamber 101, which is annular in the bottom part thereof, is such that it acts as a very low temperature heat screen for the fluid injection lines. In order to gain maximum advantage from the energy contained in the gas discharged, this gas, before being discharged from the chamber, can be guided in a helical path in a double jacket as seen previously. This arrangement offers a larger surface area for exchange between the cold gas and the wall of the chamber.

The components of the probe potentially reduced to low temperatures are supported or suspended mechanically by components made of a thermally insulating material. In the same vein, each of the fluid supply lines is made as two sections so as not to transmit heat to the spinner. The upstream part that passes through a containment chamber jacket for introducing fluid into the spinner comprising the sample holder, or extracting fluid therefrom, is made of a metallic material that is a poor conductor. This zone is referred to as the temperature-gradient zone. Although in the prior art use is made of stainless steel pipes, in the context of the invention it is possible to use pipes made of copper.

The assembly is inserted into a vacuum chamber fitted with "vacuumtight" penetrations through which the auxiliaries of use in the operation of the probe (fluids, instrumentation signals, power, mechanical adjustments, etc.) pass.

The first exchange element 110 is thermally coupled to the thermal insulation screen, notably is fixed to the thermal insulation screen.

The heat screen has a solid angle of at least $\pi$ steradians, or even of at least $2\pi$ steradians, or even of at least $3\pi$ steradians, or even substantially of $4\pi$ steradians as seen from the centre of gravity of the first member and/or of the second member, or even from any point on the first member and/or on the second member.

The invention also relates to the NMR analysis probe system 200, the system comprising the thermal insulation device 100 as the NMR analysis probe 20.

The cryogenic line supplying the probe from the cryostat has a very low consumption. As mentioned previously, it is equipped with an active heat screen 103 thermally coupled to the outgoing stream from the probe. The losses in this line, which is one meter long, superinsulated by a multilayer insulator and pumped by a high, vacuum pump are of the order of 0.11 W over all 3 probe supply lines. These losses are 10 times lower than in the flexible lines commonly used for the low-temperature supply of NMR probes. Specifically, the consumption of these lines is 30 W/m, or even 5 W/m for the best lines under static vacuum and insulated by foams or powders down to 1 W/m for a high-quality superinsulated line under dynamic vacuum.

Advantageously, the cryogenic line 16 comprises a vacuum barrier 17. Thus, the line is split into two independent zones by a "vacuum barrier" and by a set of valves 180 which are mounted on the "high-pressure" and "low-pressure" lines in such a way that the probe can be disconnected from the cryostat without the need to switch the latter off. These valves can be used to cause a fluid at a suitable temperature to be circulated so as to cause the temperature of the probe to vary, notably to raise the temperature of the probe.

The probe system 200 comprises the probe 20 and a stator. The probe and its fluid supply lines are hermetically encapsulated in a vacuum chamber, and a radiation inhibiting screen and an insulating support.

The system also comprises a central unit, not depicted, which comprises hardware and software for implementing a method for operating the insulating device and, more generally, for carrying out a method for operating the analysis system.

One embodiment of the method for operating the thermal insulation device 100 comprising the insulating screen insulating the first member and/or the second member from a thermal radiation is described hereinafter. The method comprises:
  a heat-exchange step in which heat is exchanged between the stream of the fluid, notably the gas, and the screen, notably a step of transferring heat from the heat screen to the stream, and
  a use step in which the stream is used for guiding the first member and/or for driving the movement of the first member and/or for exchanging heat with the first member, notably for cooling the first member.

In the heat-exchange step, the stream of fluid for example allows the screen to be cooled.

In the step of using the stream for exchanging heat with the first member, the stream of fluid for example allows the first member to be cooled.

For preference, the use step is performed first of all, followed by the heat-exchange step.

For preference, the first member comprises the sample holder and/or the second member comprises the NMR probe 20 and/or the cryogenic line 16 and/or the cryostat 10 and/or the electronic circuit 40.

Such an insulation device makes it possible to limit the need to warm the gases up after they have been used at the probe, the warming-up ensuring the safety of personnel, preventing them from becoming burnt on contact with very cold components and preventing them from falling by slipping in melted condensate or from electrocuting themselves. The warming-up also makes it possible to reduce the risk of equipment degradation caused by short circuits or oxidation of metallic components. Finally, at least the most costly fluids, such as the helium, can be recovered by a recovery device, for re-use. They can also be injected directly into the countercurrent exchanger 12 via a refrigeration machine in order to produce a closed loop system;

circulation is then provided by a "hot" compressor outside the cryostat or by a "cold" compressor inside the cryostat.

The invention claimed is:

1. A method of operating a thermal insulation device of an NMR analysis system comprising a sample holder, a probe, a cryostat, a cryogenic line connecting the probe to the cryostat and an electronic circuit, wherein the device comprises a thermal insulation screen configured for insulating at least one member selected from the group consisting of (i) a first member which is the sample holder and (ii) a second member which is at least one selected from the group consisting, of the probe, the cryogenic line, the cryostat, and the electronic circuit from a thermal radiation, the method comprising:
   exchanging heat between a stream of a fluid and the thermal insulation screen by contacting the fluid with the thermal insulation screen by circulating the fluid between two walls of the thermal insulation screen, and
   at least one selected from the group consisting of (i) guiding the first member by a fluid bearing using the stream, (ii) driving a movement of the first member using the stream, and (iii) exchanging heat between the first member and the stream.

2. The method according to claim 1, wherein the exchanging of heat between the stream of the fluid and the thermal insulation screen is performed after the at least one selected from the group consisting of (i) guiding the first member, (ii) driving the movement of the first member, and (iii) exchanging heat with the first member.

3. The method according to claim 1, wherein, in the heat-exchange step, heat is transferred from the thermal insulation screen to the stream.

4. The method according to claim 1, wherein, in the use step, the stream is used for cooling the first member.

5. The method according to claim 1, wherein the thermal insulation screen insulates the second member from thermal radiation.

6. An NMR analysis system comprising a sample holder, a probe, a cryostat, a cryogenic line connecting the probe to the cryostat, an electronic circuit, and a thermal insulation device, wherein the thermal insulation device comprises:
   a thermal insulation screen configured for insulating at least one member selected from the group consisting of (i) a first member which is the sample holder and (ii) a second member which is at least one selected from the group consisting of a probe of the probe system, the cryogenic line, the cryostat, and the electronic circuit from a thermal radiation,
   a first heat-exchange element configured for exchanging heat between the thermal insulation screen and a stream of fluid by contacting the fluid with the thermal insulation screen by circulating the fluid between two walls of the thermal insulation screen, and
   at least one selected from the group consisting of (i) a guide element configured for guiding the first member by a fluid bearing using the stream, (ii) a drive element configured for driving a movement the first member using the stream, and (iii) a second heat-exchange element configured for exchanging heat between the first member and the stream.

7. The device according to claim 6, wherein the first exchange element is comprised between two walls of the thermal insulation screen.

8. The method according to claim 7, wherein the first exchange element is fixed to the thermal insulation screen.

9. The device according to claim 6, wherein the first exchange element is a helical strip.

10. The device according to claim 6, wherein the thermal insulation screen has a solid angle of at least $\pi$ steradians as seen from any point on the first member.

11. The device according to claim 10, wherein the thermal insulation screen has a solid angle of at least $\pi$ steradians as seen from the centre of gravity of the first member.

12. The device according to claim 10, wherein the thermal insulation screen has a solid angle of at least $2\pi$ steradians as seen from any point on the first member.

13. The device according to claim 10, wherein the thermal insulation screen has a solid angle of at least $3\pi$ steradians as seen from any point on the first member.

14. The device according to claim 10, wherein the thermal insulation screen has a solid angle of substantially $4\pi$ steradians as seen from any point on the first member.

15. The device according to claim 6, which comprises a stream guide element guiding the stream of fluid between:
   the first heat-exchange element, and
   the at least one selected from h group consisting of (i) the guide element guiding the first member using the stream, (ii) the drive element driving the first member using the stream, and (iii) the second heat-exchange element of the first member exchanging heat using the stream.

16. The analysis system according to claim 6, wherein the cryogenic line comprises a vacuum barrier.

17. The analysis system according to claim 6, which comprises at least one first source of a high-pressure gas for generating the stream.

* * * * *